United States Patent
Dodabalapur

(10) Patent No.: US 6,215,130 B1
(45) Date of Patent: Apr. 10, 2001

(54) THIN FILM TRANSISTORS

(75) Inventor: Ananth Dodabalapur, Millington, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/137,920

(22) Filed: Aug. 20, 1998

(51) Int. Cl.$^7$ ................... H01L 31/036; H01L 31/112
(52) U.S. Cl. .................. 257/67; 257/347; 257/759; 257/66
(58) Field of Search ................... 257/759, 40, 66, 257/347, 67, 57, 59; 438/151, 155, 158

(56) References Cited

U.S. PATENT DOCUMENTS

| | | | |
|---|---|---|---|
| 5,006,913 | * 4/1991 | Sugahara et al. | 357/41 |
| 5,321,286 | * 6/1994 | Koyama et al. | 257/315 |
| 5,347,144 | * 9/1994 | Garnier et al. | 257/40 |
| 5,365,081 | * 11/1994 | Yamazaki et al. | 257/67 |
| 5,470,776 | * 11/1995 | Ryou | 437/52 |
| 5,574,291 | * 11/1996 | Dodabalapur et al. | 257/40 |
| 5,596,208 | * 1/1997 | Dodabalapur et al. | 257/66 |
| 5,612,552 | * 3/1997 | Owens | 257/202 |
| 5,659,181 | * 8/1997 | Bridenbaugh et al. | 257/40 |
| 5,852,310 | * 12/1998 | Kadosh et al. | 257/67 |
| 5,886,410 | * 3/1999 | Chiang et al. | 257/759 |
| 5,888,872 | * 3/1999 | Gardner et al. | 438/300 |
| 5,936,259 | * 8/1999 | Katz et al. | 257/40 |
| 5,981,970 | * 11/1999 | Dimitrakopoulos | 257/40 |
| 5,998,804 | * 12/1999 | Suh et al. | 257/40 |
| 6,030,860 | * 2/2000 | Gardner et al. | 438/151 |

* cited by examiner

Primary Examiner—Steven Loke
Assistant Examiner—Douglas W. Owens
(74) Attorney, Agent, or Firm—Thomas, Kayden, Horstemeyer & Risley LLP

(57) ABSTRACT

The specification describes thin film transistor integrated circuits wherein the TFT devices are field effect transistors with inverted structures. The interconnect levels are produced prior to the formation of the transistors. This structure leads to added flexibility in processing. The inverted structure is a result of removing the constraints in traditional semiconductor field effect device manufacture that are imposed by the necessity of starting the device fabrication with the single crystal semiconductor active material. In the inverted structure the active material, preferably an organic semiconductor, is formed last in the fabrication sequence.

5 Claims, 6 Drawing Sheets

THIN FILM TRANSISTORS

FIELD OF THE INVENTION

The invention relates to thin film transistors (TFTs), and more particularly to TFT integrated circuits with new designs to facilitate interconnection.

BACKGROUND OF THE INVENTION

Semiconductor integrated circuits (ICs) are ubiquitous in commercial electronics. ICs for electronic logic and memory devices are nearly always silicon based devices and ICs for photonic applications are typically III–V and II–VI based devices. Transistors, both MOS and bipolar, are made by creating impurity regions in the semiconductor substrate, and forming polysilicon or metal electrodes on the surface of the semiconductor to contact or interact with the underlying semiconductor regions. Both planar and mesa substrate configurations are used. In the manufacture of these devices, the critical nature of the semiconductor substrate, and the formation of substrate layers and electrical contacts to the substrate, dictate that the fabrication sequence begins with processing the semiconductor substrate. Subsequently in the process, after the arrays of sources, drains and gates, or emitters, bases and collectors, are formed, contacts are made to these elements to form arrays of transistors. The final phase of the fabrication is to interconnect the arrays of transistors. Thus the typical semiconductor IC is built using many layers, beginning with an active semiconductor substrate. For example, in the manufacture of a typical silicon MOS transistor, the layers may comprise a field oxide, a gate dielectric, a gate metal layer, a first interlevel dielectric layer, a first level metal interconnection layer, a second interlevel dielectric layer, a second level metal layer, and an insulating capping layer. In the essential sequence of semiconductor IC manufacture to date, the metal interconnection layers are formed last. This sequence is advantageous as long as the critical fabrication steps are performed early in the process. This factor reduces device cost by having the highest incidence of processing failures occur early in the manufacturing sequence. However, a significant drawback to this sequence is that the elements formed by these early critical steps are vulnerable to processing conditions used in later steps to complete the device. This is especially true for the semiconductor substrate, the impurity regions in the substrate, and the interfaces between the semiconductor device elements and insulating and contact layers. These portions of the device are particularly sensitive to heat. Thus e.g. the techniques used to deposit metal interconnect layers and interlevel dielectrics have been developed with careful restrictions on thermal processing. Accordingly, the typical IC manufacturing process that has evolved over time is seriously constrained due to this well known thermal susceptibility.

As IC device density increases, interconnection issues become more prominent. While individual transistor design has dominated IC technology to date, device density is becoming so large that critical steps in future IC manufacturing are likely to involve metallization and interconnect operations. In that event the least costly processes will be those that can form the interconnections first. Moreover, even in relatively low cost IC technologies, where high transistor performance is not required, interconnection technology and robust interconnection strategies may become dominant design issues.

In recent years, IC technologies have been proposed that use organic semiconductor transistors. The chief attractions of such circuits stem from the anticipated ease of processing and compatibility with flexible substrates. These advantages are expected to translate into a low-cost IC technology suitable for applications such as smart cards, electronic tags, and displays.

TFT devices are described in F. Garnier et al., Science, Vol. 265, pp. 1684–1686; H. Koezuka et al., Applied Physics Letters, Vol. 62 (15), pp. 1794–1796; H. Fuchigami et al., Applied Physics Letters, Vol. 63 (10), pp. 1372–1374; G. Horowitz et al., J. Applied Physics, Vol. 70(1), pp. 469–475; and G. Horowitz et al., Synthetic Metals, Vol. 42–43, pp. 1127–1130. The devices described in these references are based on polymers or oligomers as the active materials, in contrast with the amorphous silicon TFT structures that were developed earlier. The devices are typically field effect transistors (FETs). Polymer active devices have significant advantages over semiconductor TFTs in terms of simplicity of processing and resultant low cost. They are also compatible with polymer substrates used widely for interconnect substrates. Polymer TFTs are potentially flexible, and polymer TFT ICs can be mounted directly on flexible printed circuit boards. They also have compatible coefficients of thermal expansion so that solder bonds, conductive expoxy bonds, and other interconnections experience less strain than with semiconductor IC/polymer interconnect substrate combinations. While MIS FET devices are most likely to find widespread commercial applications, TFT devices that utilize both p-type and n-type organic active materials are also known. See e.g., U.S. Pat. No. 5,315,129. S. Miyauchi et al., Synthetic Metals, 41–43 (1991), pp. 1155–1158, disclose a junction FET that comprises a layer of p-type polythiophene on n-type silicon.

Recent advances in polymer based TFT devices are described in U.S. Pat. No. 5,596,208, issued May 10, 1996, U.S. Pat. No. 5,625,199, issued Apr. 29, 1997, and U.S. Pat. No. 5,574,291, issued Nov. 12, 1996, all of which are incorporated herein by reference, especially for descriptions of useful materials. With the development of both n-type and p-type active polymer materials, as described in these patents, complementary ICs can be readily implemented, as detailed particularly in U.S. Pat. No. 5,625,199.

For the purpose of definition the term organic semiconductor is intended to define that category of materials which contain a substantial amount of carbon in combination with other elements, or that comprises an allotrope of elemental carbon, and exhibits charge carrier mobility of at least $10^{-3}$ $cm^2/Vs$ at room temperature (20° C.). Organic semiconductors of interest for TFTs typically have conductivity less than about 1 S/cm at 20° C.

Although the new TFT devices represent a significant departure from the semiconductor IC technology of the past, the configurations of these devices, and the overall fabrication approach, follow closely those used for silicon IC fabrication. For example, even though the substrate in these TFT devices is as critical an element as in traditional IC structures, either from the standpoint of performance or manufacturing yield, these IC devices are consistently produced by forming the active devices in a transistor array, and then forming the interconnections.

SUMMARY OF THE INVENTION

We have developed a radically new approach to integrated circuit fabrication in which the interconnections are formed prior to forming the active transistors. The IC devices resulting from this sequence have inverted structures, with the interconnections buried next to the substrate and the active elements on top. This approach follows an analysis of transistor fabrication sequence, and the realization that the use of organic semiconductor active materials removes critical constraints present in traditional semiconductor IC manufacturing. In particular, the thermal constraints mentioned earlier are removed, allowing a wide choice of processing conditions for fabricating the interconnection levels. Moreover, if interconnection strategies, performance and yield become dominant with new low cost TFT technologies, this invention allows the interconnection phase of TFT IC manufacture to occur early in the sequence, thus affording the potential for higher yields and lower cost.

DETAILED DESCRIPTION

Figure 1:
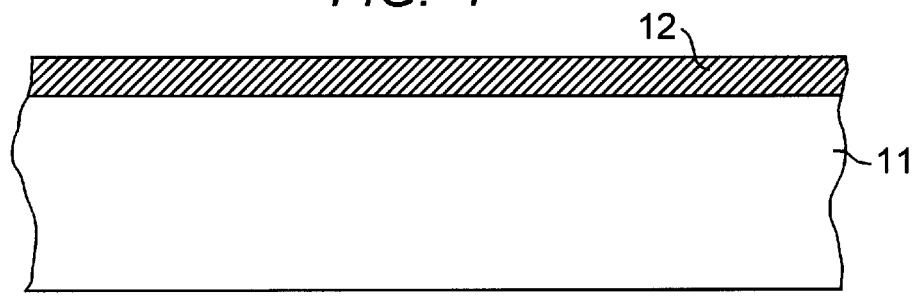
FIGS. 1–17 are schematic representations of process steps useful for producing one embodiment of an inverted IC according to the invention.

With reference to FIG. 1, a portion of an IC substrate is shown at 11. A single inverted TFT will be illustrated for simplicity, but it will be understood that the single device is representative of a large integrated array of devices. Also, the features shown in the figures herein are not to scale.

The substrate is preferably an insulating material such as glass or a polymer. It may be rigid or flexible, and it may comprise a standard printed circuit substrate of expoxy or ceramic. Alternatively it may be silicon on which an insulating layer of $SiO_2$ is grown or deposited. The first level metal is shown at 12. In this inverted structure this level is referred to as the first level because it is formed first but, as will be appreciated by those skilled in the art, it corresponds to the second level metallization in traditional structures. The metal may be any of a variety of conductive materials. The common choice in standard IC technology is aluminum. However, due to the nature of the structures described here the choice of conductive material can be made from a larger universe than is usually considered, including the standard materials, i.e. aluminum, TiPdAu, TiPtAu, TaN. TiN, etc., as well as non-traditional choices most notably, copper and conductive polymers such as polyanaline and metal containing polymer inks. The use of polymer conductors may be favored in application where a degree of flexibility is desired. The choice of deposition techniques is also wider since the structure at this stage in the processing, as contrasted with traditional IC processing at this stage, have no thermally sensitive components. Thus this deposition step, as well as subsequent deposition and etching steps use for forming the two level or multi-level metallization interconnections, may involve significant substrate heating if that is otherwise convenient and cost effective. Thus the metal layer can be evaporated, or sputtered. The thickness of the metal layer can vary widely, but will typically be in the range 0.05 to 2 $\mu$m.

Figure 2:
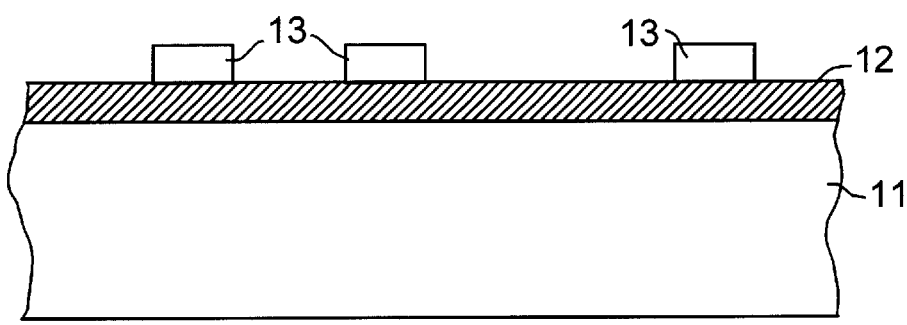
Figure 3:
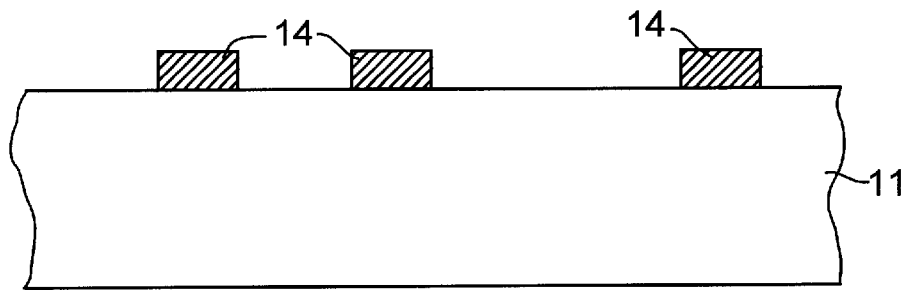

The next step, represented by FIG. 2, is to pattern the first level metallization using a lithographic mask 13, which is typically a photolithographic mask, but may be formed using e-beam or x-ray lithography. Other masking steps, to be described below, may also utilize these alternative lithography technologies. The first metal layer is then patterned by standard etching, e.g. plasma or RIE etching, to produce the pattern of metal runners 14 as shown in FIG. 3.

With a wide choice of conductive materials available, it may be useful, in applications where the interconnect density is not large, to print the circuit directly, using screen printing, stenciling, ink jet printing or a similar technique.

Figure 4:
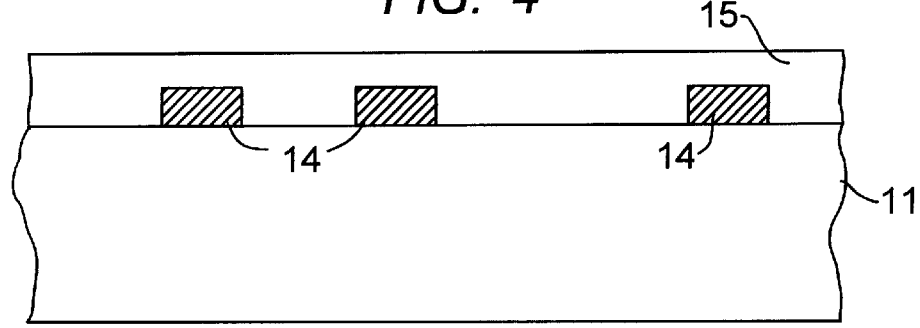

With reference to FIG. 4, the first interlevel dielectric 15 is formed over the first level metal pattern as shown. The interlevel dielectrics in the structures according to the invention may be of a variety of insulating materials such as spin on glass (SOG), or $Si_3N_4$ or $SiO_2$ deposited by CVD for example. In the TFT structures described here, it is expected that the use of polymer materials wherever they can be effective will be desirable, both from the standpoint of processing simplicity and cost, and also to produce IC structures that tolerate strain, i.e. are somewhat flexible. Accordingly, for such applications the use of polyimide or similar organic polymer insulating material insulators is recommended. A suitable material is a polyimide supplied by Nissan Chemical Company under the designation RN-812. This material can easily be produced in layers with 0.1–1 $\mu$m thickness, which have desirable insulating properties. The application technique for organic insulators is typically spin coating or solution casting. Some inorganic insulators, notably spin-on-glass, also share the property of convenient application. In some application, where fine pattern dimensions are not required, the dielectric layer may be applied as a patterned layer, already containing the interlevel windows.

Figure 5:
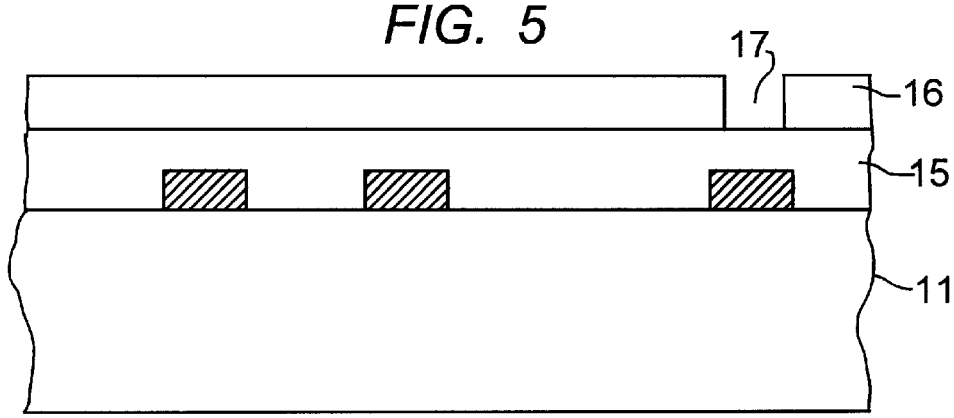
Figure 6:
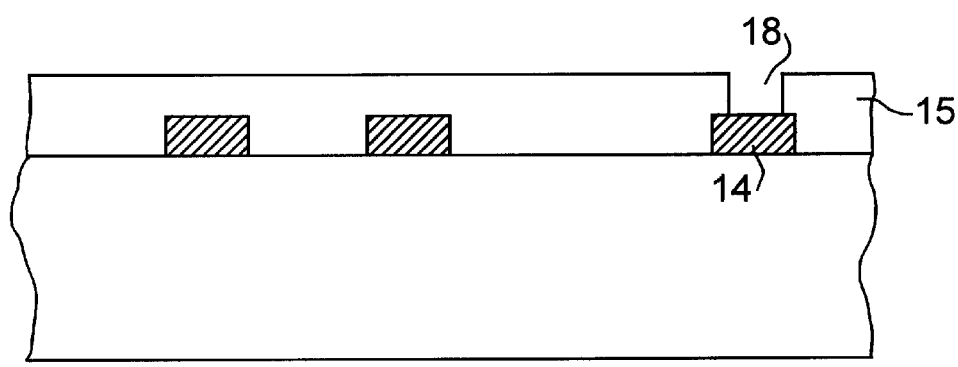

The interlevel dielectric is then masked if required with patterned mask 16 as shown in FIG. 5, and the portion of dielectric layer 15 exposed by the opening 17 in the resist is etched to form a window to interconnect the first and second levels. The mask opening is aligned to metal runner 14 in the first level interconnection pattern. A single interlevel interconnection is shown for simplicity, but a typical IC will have many such interlevel interconnections. These interlevel interconnections are standard, and techniques for forming the interlevel windows are well known. For example, if the dielectric layer is $SiO_2$ the windows may be formed by plasma etching or RIE. The resulting structure is shown in FIG. 6, with interlevel window 18 formed in the dielectric layer 15.

Figure 7:
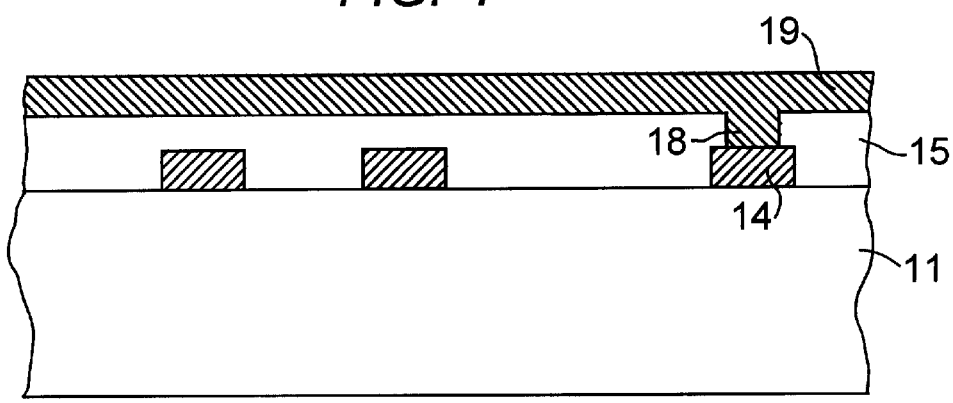
Figure 8:
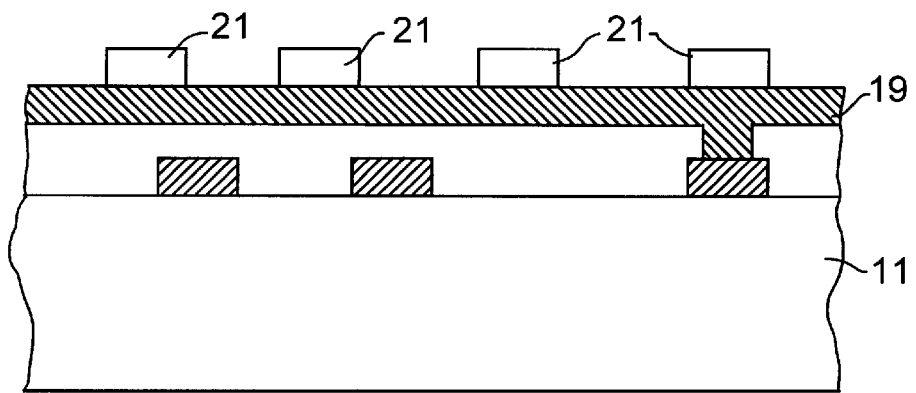
Figure 9:
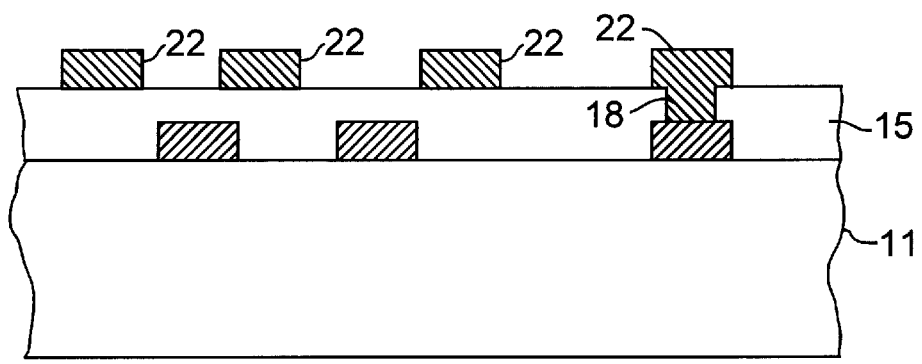

The second level metal, 19, is deposited over the first interlevel dielectric 15 as shown in FIG. 7. The second level metal may be the same as, or may be different from, the first level metal. The second level metal is patterned in a manner similar to the first level using mask 21 as shown in FIGS. 8 and 9. One of the runners 22 in the second level metallization interconnects as shown with the first level metallization 14 at 18.

Figure 10:
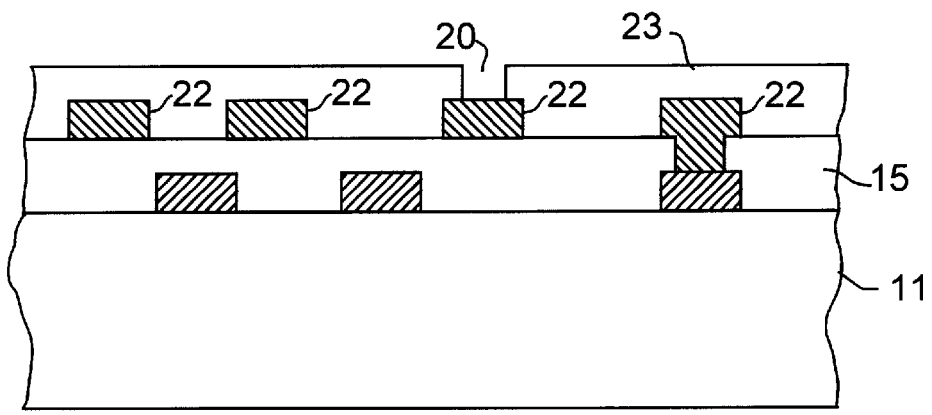

The next step is to form the second interlevel dielectric 23 as shown in FIG. 10. This layer may be formed in a manner similar to layer 15, and interlevel dielectric 23 is also provided with through holes or windows 20 for interlevel interconnections between the second level and the gate level to be formed next.

Figure 11:
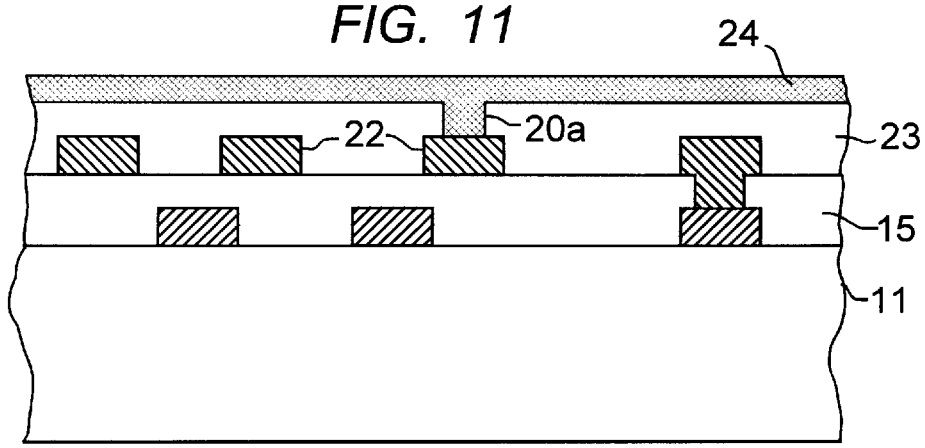
Figure 12:
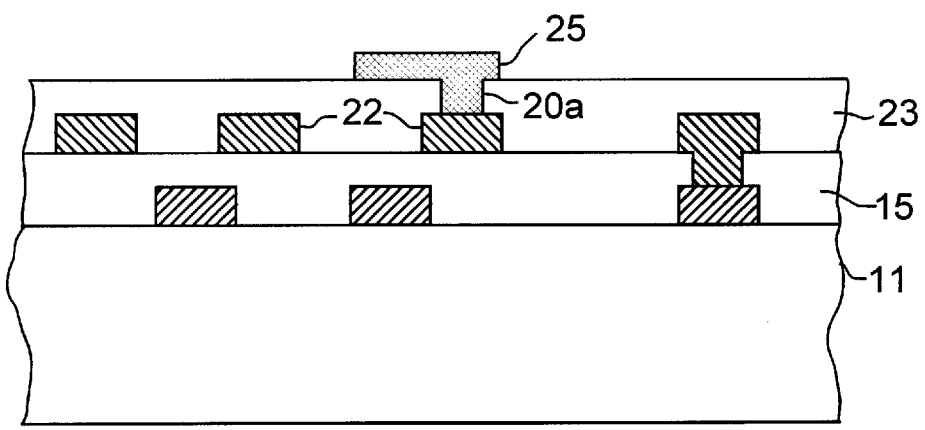

The gate level metal, usually the first level metal in a traditional structure, and usually of polysilicon, is formed late in the sequence of the invention, and may comprise a wide variety of metals. The usual requirement that the gate level metal be relatively refractory to withstand the conventional implantation drive steps is eliminated in the process of the invention, so the gate material can be selected from many materials, even aluminum or copper. However, the art has extensive experience with silicon gates insulated with grown $SiO_2$. Tantalum gates insulated with TaN or TiN may also be convenient. The gate metal layer 24 is shown in FIG. 11 deposited over the second interlevel dielectric layer 22 and into the windows 20a that interconnect gates to the 22 metal. The gate metal layer is then patterned (FIG. 12) by conventional lithography to form gate structures 25. Conducting polymers are also suitable for the gate metal and are especially compatible with other elements in the structures described here.

Figure 13:
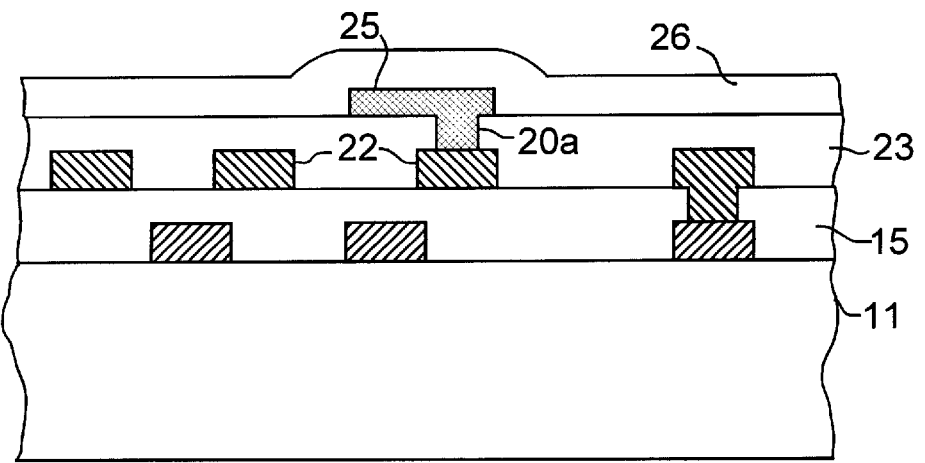

The gate dielectric 26 is then formed over the structure as shown in FIG. 13. The gate dielectric may be of a conventional oxide or nitride as indicated above, or may be SOG or an organic insulator such as polyimide that can be formed conveniently by spin-on techniques. An example of such a material that has been used successfully in this application is pre-imidized polyimide, supplied by Nissan Chemical Company under the designation SE-1180. This material can be spun on at 4000 RPM and cured at 120° C. for 2 hours to produce a coating with a thickness of 70 nm. If desired, the gate material may be polysilicon, and the gate dielectric grown as a surface layer over the polysilicon in which case the gate dielectric layer 26 would not cover the entire second interlevel dielectric as it appears in FIG. 11.

Figure 14:
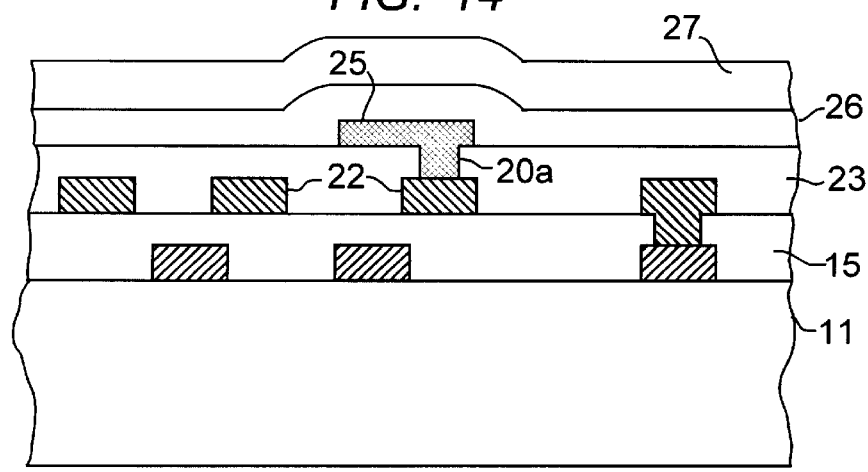
Figure 15:
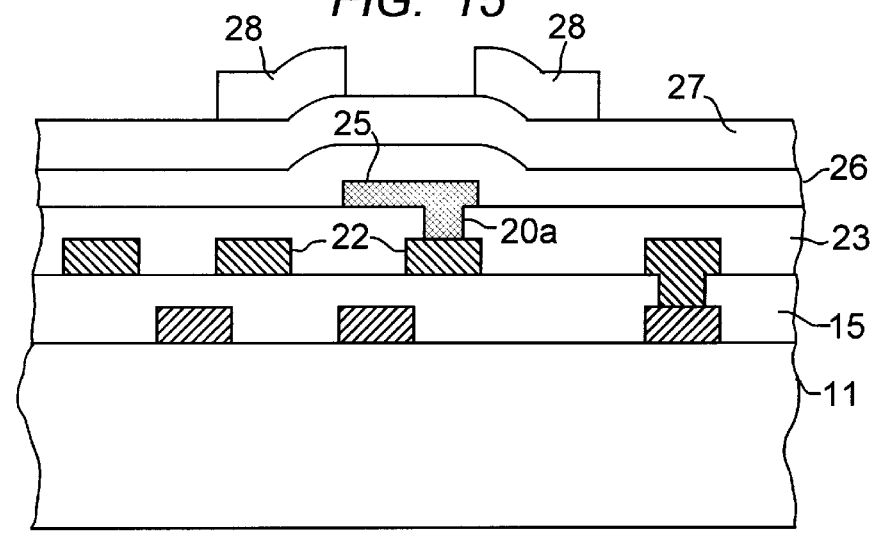
Figure 16:
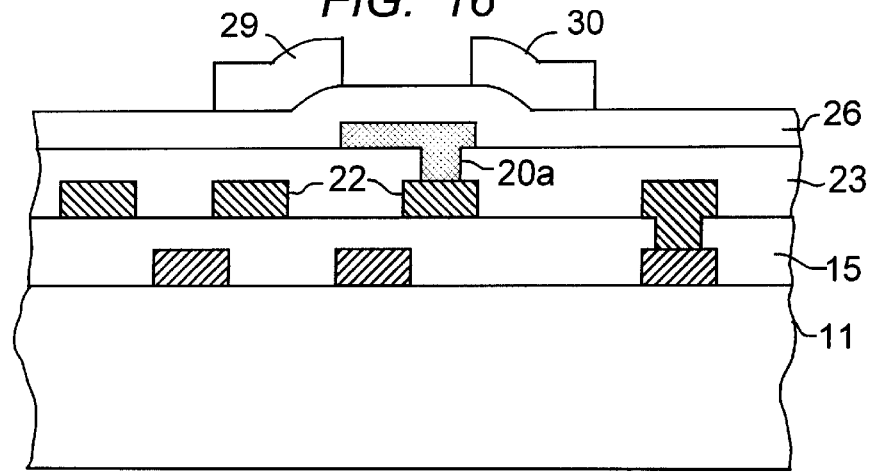

The source/drain contact layer 27 is then deposited over the structure as shown in FIG. 14, and is then patterned using conventional lithographic mask 28, shown in FIG. 15, to define the source electrode 29 and drain electrode 30 as shown in FIG. 16. Alternatively, the source and drain can be formed using known additive technology. The source and drain electrode materials may be polysilicon or any of a number of metal conductors, or may be organic conductors such as polyaniline. For display applications the electrodes may be indium tin oxide. In the work that resulted in this invention the source and drain electrodes were gold.

Figure 17:
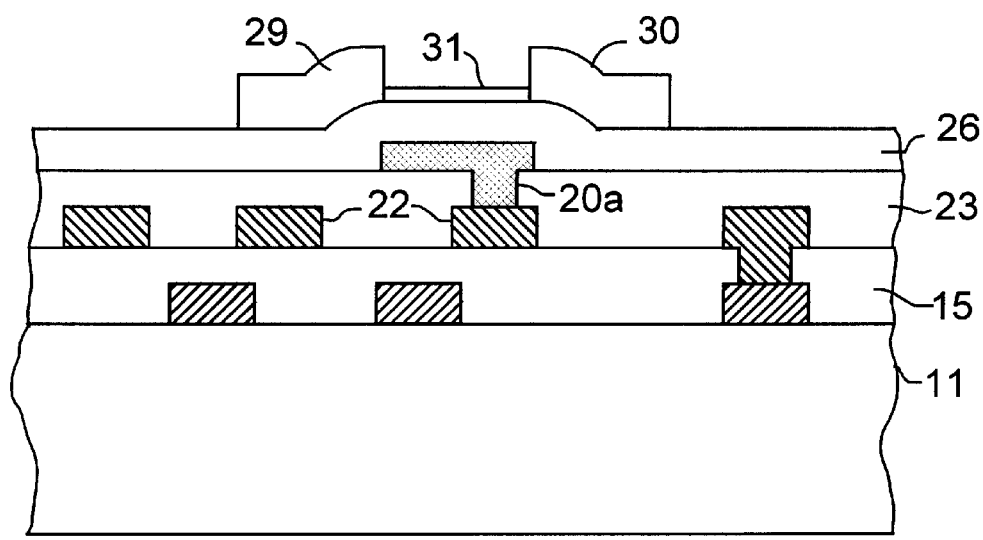

The final essential step in the process of the invention, which is the first step in the traditional FET process, is illustrated in FIG. 17 and is the formation of the active semiconductor body 31 in which the field effect is realized, and in which the FET channel extends between source 29 and drain 30. In this invention, the active material is preferably an organic semiconductor, but may also be an inorganic TFT material such as amorphous silicon, polysilicon, CdSe, $TiO_2$, ZnO, $Cu_2S$. As an example of the use of an inorganic material, undoped α-Si can be deposited by plasma-enhanced chemical vapor deposition (PE-CVD) or RF sputtering.

A wide variety of organic semiconductors have now been developed for TFT devices. Among these are:

i. perylene tetracarboxylic dianhydride (PTCDA), the imide derivative of PTCDA;

ii. napthalene tetracarboxylic dianhydride (NTCDA);

iii. fluorinated copper pthalocyanine;

iv. α-sexithiophene;

v. p,p'-diaminobisphenyls in polymer matrices;

vi. tetracene or pentacene, or end substituted derivatives thereof;

vii. oligomers of thiophene with the degree of oligomerization $\geq 4$ and $\leq 8$, linked via the 2- and 5-carbons;

viii. alternating co-oligomers of thienylene and vinylene, with thiophenes as terminal groups and 3–6 thiophene rings, linked via their 2- and 5-carbons;

ix. linear dimers and trimers of benzo[1, 2-b: 4, 5-b'] dithiophene;

x. oligomers of v. vi. and vii. with substituents (e.g., alkyl substituents with 1–20 carbons) on the 4- or 5-carbon of the end thiophenes;

xi. a-hexathienelene;

xii. regioregular poly(thiophene)s.

Both p- and n-type materials are contained in this list and can be combined as needed for complementary ICs.

Figure 18:
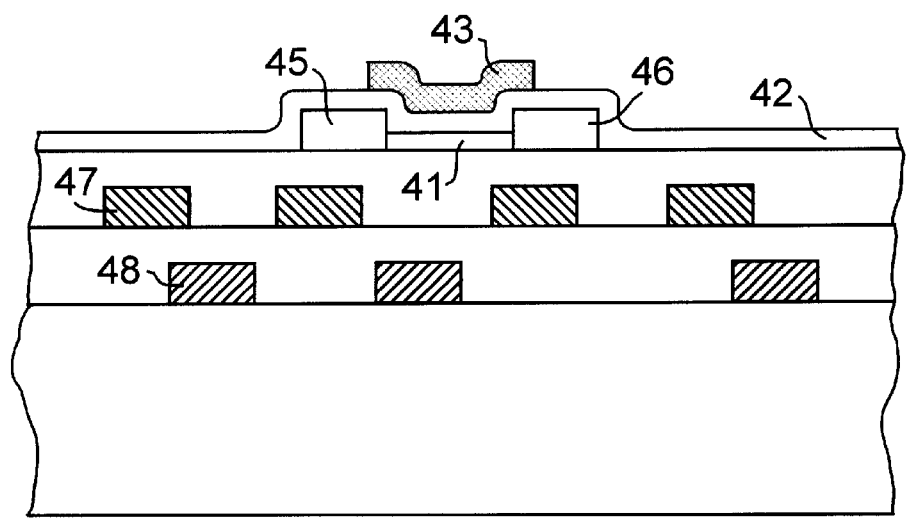
FIG. 18 is a schematic view of a second embodiment of an inverted IC.

The TFT structure described and produced by the foregoing sequence of steps is but one form of TFT to which the invention can be applied. An alternative is shown in FIG. 18. This device is a modified form of J-FET with n-type (or p-type) layer 41 and n-type (or p-type) layer 42 together forming a p-n junction. The gate 43 controls the pinch-off of the channel between source 45 and drain 46. The first level metal is shown at 47 and the second level metal 48 are essentially the same as described in connection with the FET of FIG. 17.

As mentioned above, for simplicity the interconnections between the gate level, or the source and drain electrode level, and the interconnect levels are not shown but are standard. For example, an interconnection between gate 43 and first level metal runner 47 of FIG. 18 would be made via a window through layer 42, and through a capping insulating layer, if present. Contact with the gate 43 may be made directly, via an extension of layer 43 (in the dimension normal to the plane of the figure) or through an opening in a capping insulating layer. In the case of the device of FIG. 17, interlevel interconnections between the gates and the second level metal runners (or the first level runner in a single metallization level IC) would be made via windows in the second interlevel dielectric.

The devices shown in FIGS. 17 and 18 are representative of the generic category of field effect transistors, and demonstrate the principle of the invention that can be applied to any form of FET device, namely that the interconnect levels are formed first and the transistor last.

As indicated earlier, the features in the figures are not necessarily to scale. The dimensions of the active devices, i.e. the TFTs, can be made very small using fine line techniques. In particular, the source-to-drain spacing can be 5 nm or less. At these small dimensions a single polymer chain, or a few organic molecules span the source-to-drain distance. With such an IC technology, it is possible to achieve extremely high integration densities. The molecular nature of organic/polymer semiconductors allows the size of such transistors to shrink to such small dimensions, and also enables effective isolation between individual transistors. The dimensions of some of the interconnections, e.g. power and ground interconnections on level 2 metal, may be significantly larger than those that appear in the figures.

The illustrative example given above and described in conjunction with FIGS. 1–17 is for a device with two levels of interconnect. The invention is equally applicable to ICs with one or even three levels of interconnect. The generic feature of the invention is the formation of at least one interconnect level prior to the formation of a field effect transistor over the interconnect level, with at least some of the sources or drains or gates of the transistors interconnected via the interconnect level.

Various additional modifications of this invention will occur to those skilled in the art. All deviations from the specific teachings of this specification that basically rely on the principles and their equivalents through which the art has been advanced are properly considered within the scope of the invention as described and claimed.

What is claimed is:

1. An integrated circuit (IC) device comprising:
   a. a planar substrate (11) with the top surface thereof comprising a continuous co-planar layer of insulating material,
   b. a conductive interconnection circuit (22) on the substrate, c. an interlevel insulating layer (23) covering the conductive interconnection circuit,
d. a plurality of field effect transistor gates (25) formed on the interlevel insulating layer,
e. a gate insulating layer (26) formed over the plurality of field effect transistor gates,
f. a plurality of source and drain electrodes (29,30) formed on the gate insulting layer,
g. a semiconductor layer (31) formed between the source and drain electrodes, wherein the semiconductor layer is a polymer thin film, and
h. means comprising conductive vias (20a) extending through the interlevel insulating layer for interconnecting one or more of the plurality of field effect transistor gates and the plurality of source and drain electrodes to the conductive interconnection circuit.

2. The IC device of claim 1 wherein said interlevel insulating layer is an organic polymer.

3. The IC device of claim 2 wherein the said interconnection circuit comprises an organic polymer.

4. The IC device of claim 1 wherein said source and said drain are separated by a distance of less than 5 nm.

5. An integrated circuit (IC) device comprising:
a. a planar substrate (11) with the top surface thereof comprising a continuous co-planar layer of insulating material,
b. a first conductive interconnection circuit (14) on the substrate,
c. a first interlevel insulating layer (15) covering the first conductive interconnection circuit,
d. a second conductive interconnection circuit (22) on the first interlevel insulating layer,
e. a second interlevel insulating layer (23) covering the second conductive interconnection circuit,
f. a plurality of field effect transistor gates (25) formed on the second interlevel insulating layer,
g. a gate insulating layer (26) formed over the plurality of field effect transistor gates,
h. a plurality of source and drain electrodes (29,30) formed on the gate insulting layer,
i. a semiconductor layer (31) formed between the source and drain electrodes, wherein the semiconductor layer is a polymer thin film,
j. means comprising conductive vias extending through said first interlevel insulating layer for interconnecting the first conductive interconnection circuit with the second conductive interconnection circuit,
k. means comprising conductive vias extending through the second interlevel insulating layer for interconnecting one or more of the plurality of field effect transistor gates and the plurality of source and drain electrodes to the second conductive interconnection circuit.

* * * * *